United States Patent

Araki et al.

[11] Patent Number: 5,355,219
[45] Date of Patent: Oct. 11, 1994

[54] GAP CONTROL APPARATUS AND METHOD UTILIZING HETERODYNE SIGNAL PHASE DIFFERENCE DETECTION

[75] Inventors: Kiyoshi Araki, Ibaraki; Juro Yasui, Osaka, both of Japan

[73] Assignee: Matsushita Electric Industrial Co., Ltd., Kadoma, Japan

[21] Appl. No.: 168,140

[22] Filed: Dec. 17, 1993

[30] Foreign Application Priority Data

Dec. 18, 1992 [JP] Japan .................. 4-338850

[51] Int. Cl.$^5$ .............................. G01B 9/02
[52] U.S. Cl. .............................. 356/355; 356/349
[58] Field of Search ............... 356/349, 354, 355, 357, 356/356

[56] References Cited

U.S. PATENT DOCUMENTS

| 4,895,447 | 1/1990 | Järisch et al. | 356/356 |
| 5,000,573 | 3/1991 | Suzuki et al. | 356/349 |
| 5,100,234 | 3/1992 | Ishibashi et al. | 356/349 |
| 5,151,754 | 9/1992 | Ishibashi et al. | 356/356 |

FOREIGN PATENT DOCUMENTS 60-8694 7/1986 Japan .

*Primary Examiner*—Samuel A. Turner
*Assistant Examiner*—Russell C. Wolfe
*Attorney, Agent, or Firm*—Willian Brinks Hofer Gilson & Lione

[57] ABSTRACT

Two diffraction gratings having the same grate pitch are respectively attached to a semiconductor wafer and a mask to be used in lithography in production of a semiconductor, such that the diffraction gratings are parallel to each other. When first and second frequency lights respectively having different frequencies, are incident, through a light path adjusting system, upon the mask- and wafer-side diffraction gratings in the directions of the first order diffraction angles symmetric with respect to normal-line directions of the diffraction gratings, the frequency lights first orderly diffracted by the diffraction gratings, interfere with each other, thus forming mask- and wafer-side interference lights. An initial phase difference $\Delta\phi 0$ between the interference lights, is detected. Then, the light path adjusting system is adjusted to shift the interference lights by the same angle $\theta 1$ in the same direction, and a later phase difference $\Delta\phi 1$ between the interference lights thus shifted, is detected. Based on the relation of $\Delta\phi 1 - \Delta\phi 0 = (2\pi G \tan\theta 1)/(P/2)$, a mask-wafer gap G is detected with high precision according to the change in phase difference ($\Delta\phi 1 - \Delta\phi 0$). This improves the precision of setting the gap G in a semiconductor production.

4 Claims, 9 Drawing Sheets

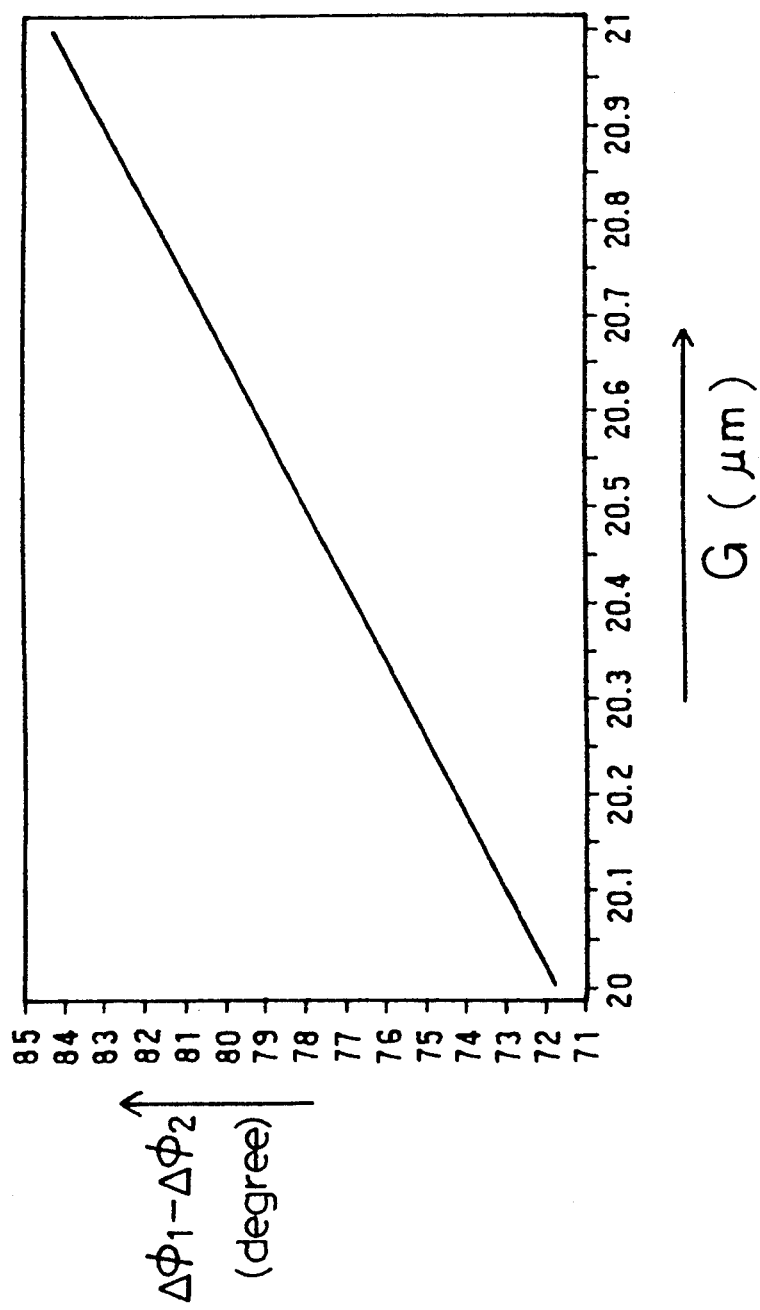

GAP CONTROL APPARATUS AND METHOD UTILIZING HETERODYNE SIGNAL PHASE DIFFERENCE DETECTION

BACKGROUND OF THE INVENTION

The present invention relates to a gap control method and a gap control apparatus suitably used in a light exposure apparatus, in particular an X-ray exposure apparatus, used in the course of production of semiconductor devices.

With a recent demand for higher density and higher operating speed of a large scale integrated circuit (LSI), the miniaturization of elements is required. Finer element s can be formed as the wavelength of light used in photolithography in production of such an LSI, is shorter. In this connection, there is used an X-ray lithography using X-rays as a light source. In mask alignment in such an X-ray lithography, an X-ray mask and a wafer are disposed opposite to each other with a proximity gap of, for example, 20 μm, provided therebetween, and X-rays are irradiated to the wafer such that predetermined parts thereof are exposed to the X-rays. By reducing the gap between the X-ray mask and the wafer, it is expected to produce a finer element. It is therefore required to set, with high precision, the gap between the X-ray mask and the wafer.

As the gap setting method in conventional mask alignment, there is used a method using a lens of double focal points or a lens of single focal point.

In FIG. 7 showing the method using a lens of double focal points, there are shown a lens of double focal points 51, a wafer 52, a wafer mark 53, an X-ray mask 54 and a mask mark 55. First, a first focal point of the lens of double focal points 51 is aligned with the wafer mark 53 on the wafer 52, and a second focal point is then aligned with the mask mark 55 on the X-ray mask 54, thus setting the gap between the wafer 52 and the X-ray mask 54.

FIG. 8 shows another gap setting method, i.e., the method using a lens of single focal point. In FIG. 8, there are shown a lens of single focal point 61, a lens driving system 62 and a drive-amount detecting system 63. First, the focal point of the lens of single focal point 61 is adjusted with a wafer mark 53 on a wafer 52. Then, the lens 61 is driven by the lens driving system 62 such that the focal point of the lens 61 is adjusted with a mask mark 55 on an X-ray mask 54. This drive amount is detected by the drive-amount detecting system 63, thus calculating the gap between the X-ray mask 54 and the wafer 52.

In an X-ray exposure apparatus, the gap between the X-ray mask and the wafer is set in the vicinity of 20 μm, and mask alignment and X-ray exposure are then carried out.

On the other hand, there is known, as a high-precision mask-wafer alignment apparatus, an apparatus of the heterodyne system using so-called heterodyne interference light in which two laser lights respectively having slightly different frequencies, interfere with each other, as disclosed in a publication "Light Technology Contact" (vol. 28, No. 7, 1991, p. 389).

With reference to FIGS. 9 and 10, the following description will discuss the alignment principle in the heterodyne system.

As shown in FIG. 9, when two laser lights respectively having slightly different frequencies f1, f2 are incident upon a diffraction grating b in the respective directions of primary diffraction angles $\theta a$, $\theta b$ which are symmetric with respect to a normal line of the diffraction grating b, the laser lights having the frequencies f1, f2 are primarily diffracted in the normal line of the diffraction grating b and interfere with each other to form a beat signal Ir( t ) . The beat signal Ir(t) is expressed by the following equation:

$$Ir(t) = |E1(t)+E2(t)|^2 = A1^2 + A2^2 A1A2 \cdot \cos(2\pi|f1-f2|t + \phi 1 - \phi 2)$$

wherein A1, A2 are the amplitudes of the laser lights, $\phi 1$, $\phi 2$ are the initial phases thereof, and E1(t), E2(t) are the amplitude intensities thereof which are respectively expressed by the following equations:

$$E1(t) = A1 \cdot \exp j(2\pi f1 t + \phi 1)$$

$$E2(t) = A2 \cdot \exp j(2\pi f2 t + \phi 2)$$

When the diffraction grating b is moved from the position shown by a solid line in FIG. 9 to the position shown by a broken line therein (displacement $\Delta x$), changes in light path length of the two laser lights are equal to $\Delta x \sin \theta a$, $\Delta x \sin \theta b$, respectively. Accordingly, a beat signal Ib(t) is expressed by the following equation:

$$Ib(t) = A1^2 + A2^2 + A1A2 \cdot \cos\{2\pi|f1-f2|t + \phi 1 - \phi 2 + 2\pi\Delta x/(p/2)\}$$

wherein P is the grate pitch in the diffraction grating.

That is, the phase difference between the beat signals Ir(t) and Ib(t), is linearly changed in a cycle of the displacement amount P/2 of the diffraction grating b.

The alignment apparatus of the heterodyne system utilizes the principle above-mentioned. As shown in FIG. 10, a first diffraction grating a is attached to a mask m, a second diffraction grating b is attached to a semiconductor wafer w, and the mask m and the wafer w are opposite to each other with a gap G provided therebetween. In such an arrangement, changes in light path length of two laser lights are equal to G(1+cos $\theta a$), G(1+cos $\theta b$), respectively. When $\theta a$ is equal to $\theta b$, such changes are equal to each other and therefore cancelled by each other. This does not cause the beat signal to be changed in phase. More specifically, even though the gap G is changed, no influence is exerted to positional detection because of the transversely symmetric optical systems.

It is now supposed that the positional shift between the mask m and the wafer w is $\Delta x$. In this case, the positional shift $\Delta x$ between the mask and the wafer is detected when a phase difference ($\phi 2 - \phi 1$) is detected according to the following equation (1):

$$\phi 1 - \phi 2 = 2\pi \Delta x/(P/2) \quad (1)$$

At this time, the phase difference ($\phi 2 - \phi 1$) can be detected with precision of about 1° including errors generated in an electric signal processing. As a result, the mask m and the wafer w can be positionally aligned with each other with high precision.

In the mask-wafer positional alignment apparatus using the heterodyne interference system above-mentioned, it is possible to positionally align the mask with the wafer with high precision corresponding to the high resolution of an X-ray exposure apparatus. In the conventional gap setting method mentioned earlier, it is possible to set the gap of about 1 μm or more. However, it is not possible to set the gap of not greater than the focal depth of a lens to be used, and it is difficult to set the focal depth to 1 μm or less. It is therefore difficult to set the gap between the mask and the wafer with high precision required in the X-ray lithography. This disadvantageously fails to sufficiently utilize the improved precision of mask positional alignment.

SUMMARY OF THE INVENTION

Consideration is now made on the equation (1) in a mask alignment apparatus using the heterodyne interference system above-mentioned. When the optical systems are inclined while the mask and wafer having diffraction gratings attached thereto, are secured to the stages, a change in phase difference between beat signals detected at two positions where the optical systems have not been inclined yet and have been inclined, only depends on the gap G regardless of the mask-wafer positional shift $\Delta x$. In view of the foregoing, it is an object of the present invention to detect the gap with the use of a phase difference of heterodyne interference light to be detected with high precision, thus improving the gap detecting precision, i.e., the gap setting precision, in a lithography process.

To achieve the object above-mentioned, the present invention provides a gap control method of detecting the gap between a first object and a second object and setting the gap thus detected to a predetermined value, and this gap control method comprises the steps of: attaching a first diffraction grating to a first object and a second diffraction grating to a second object, the grate pitches in both diffraction gratings being equal to each other, the first diffraction grating being parallel to the second diffraction grating; causing two coherent lights respectively having slightly different frequencies to be incident upon the diffraction gratings in the directions of the first order diffraction angles (initial incident directions ) symmetric with respect to predetermined common directions ( initial diffraction directions ) of the diffraction gratings, so that the coherent lights are first orderly diffracted in the initial diffraction directions; detecting, as an initial phase difference, a phase difference between first interference light formed by the interference of the coherent lights first orderly diffracted by the first diffraction grating, and second interference light formed by the interference of the coherent lights first orderly diffracted by the second diffraction grating; causing the coherent lights to be incident upon the diffraction gratings in later incident directions slightly inclined at the same predetermined angle in the same direction with respect to the initial incident directions, so that the coherent lights are first orderly diffracted in later diffraction directions inclined at a predetermined angle with respect to the initial diffraction directions; detecting, as a later phase difference, a phase difference between first interference light formed by the interference of the coherent lights first orderly diffracted by the first diffraction grating, and second interference light formed by the interference of the coherent lights first orderly diffracted by the second diffraction grating; and operating, according to a change in phase difference between the detected initial and later phase differences, the gap between the first object and the second object, based on the relation between change in phase difference and gap value, such relation being determined by the grate pitch of the diffraction gratings.

According to the arrangement above-mentioned, when two coherent lights respectively having different frequencies, are incident upon the diffraction gratings in the initial incident directions, the coherent lights are first orderly diffracted by the diffraction gratings, reflected in the common initial diffraction directions and interfere with each other, thus forming first interference light and second interference light. Then, there is detected, as an initial phase difference, a phase difference between these first and second interference lights. Then, when the coherent lights are incident upon the diffraction gratings in the later incident directions inclined at the same predetermined angle in the same direction with respect to the initial incident directions, the reflection directions (later diffraction directions) are also inclined at the same predetermined angle with respect to the initial reflection directions (initial diffraction directions). A phase difference between the interference lights thus diffracted, is defined as a later phase difference. A change in phase difference between the initial and later phase differences, has no relation with the positional shift between the diffraction gratings, but depends on the grate pitch of the diffraction gratings and is proportional to the gap between the diffraction gratings. Accordingly, the gap between the first and second objects can be obtained with high precision according to the change in phase difference detected with high precision.

In the method above-mentioned, the initial incident angles of the coherent lights may be set such that the initial diffraction directions by the diffraction gratings are normal-line directions of the diffraction gratings. In such an arrangement, the initial incident directions of the coherent lights are set such that the lights are first orderly diffracted in the normal-line directions of the diffraction gratings which form the bases of the optical systems. Accordingly, the procedure for gap detection is simplified and the detecting precision is improved.

The present invention is also directed to a gap control apparatus for detecting the gap between a first object and a second object and setting the gap thus detected to a predetermined value. The gap control apparatus of the present invention comprises; a first diffraction grating attached to a first object; a second diffraction grating attached to a second object such that the second diffraction grating is parallel to the first diffraction grating, the grate pitches in both diffraction gratings being equal to each other; coherent light supply means for emitting two coherent lights respectively having slightly different frequencies; a light path adjusting system arranged such that two coherent lights emitted from the coherent light supply means are incident upon the diffraction gratings in the directions of the first order diffraction angles symmetric with respect to predetermined common directions of the diffraction gratings, and that the first order diffraction directions of the coherent lights by the diffraction gratings can be changed; phase difference detecting means for detecting a signal relating to a phase difference between first interference light formed by the interference of the coherent lights first orderly diffracted by the first diffraction grating, and second interference light formed by the interference of the coherent lights first orderly diffracted by the second diffraction grating; incident direction control means for controlling the light path adjusting system such that the directions of the coherent lights incident upon the diffraction gratings are changed to (i) initial incident directions in which the first order diffraction directions by the diffraction gratings are predetermined initial diffraction directions, and (ii) later incident directions in which the first order diffraction directions by the diffraction gratings are later diffraction directions inclined at a predetermined angle with respect to the initial diffraction directions; and gap operating means for operating, according to a change in phase difference between initial and later phase differences detected by the phase difference detecting means in the initial and later first order diffraction directions to be controlled by the incident direction control means, the gap between the first and second objects, based on the relation between change in phase difference and gap value, such relation being determined by the grate pitch of the diffraction gratings.

According to the arrangement above-mentioned, a change in phase difference between the initial and later phase differences of the interference lights obtained in the initial and later diffraction directions, has no relation with a positional shift between the diffraction gratings, but is proportional to the gap between the diffraction gratings. Accordingly, the gap between the first and second objects can be detected with high precision according to the change in phase difference detected with high precision.

In the arrangement above-mentioned, the first object may be a wafer on which a semiconductor device is to be formed, and the second object may be a mask to be used in lithography of the wafer. In such an arrangement, provision may be made such that the gap control apparatus also serves as a mask-wafer alignment apparatus. In this case, most component elements can be commonly used. This advantageously simplifies the structure of the apparatus in its entirety and lowers the cost thereof. Further, mask-wafer gap setting and positional alignment can be continuously carried out, so that the alignment operation can be carried out in a shorter period of time.

BRIEF DESCRIPTION OF THE DRAWINGS

FIG. 5 is a view illustrating an example of a change in signal with respect to a change in gap;

DETAILED DESCRIPTION OF THE PREFERRED EMBODIMENTS

The following description will discuss embodiments of the present invention with reference to FIGS. 2 to 6.

Figure 1:
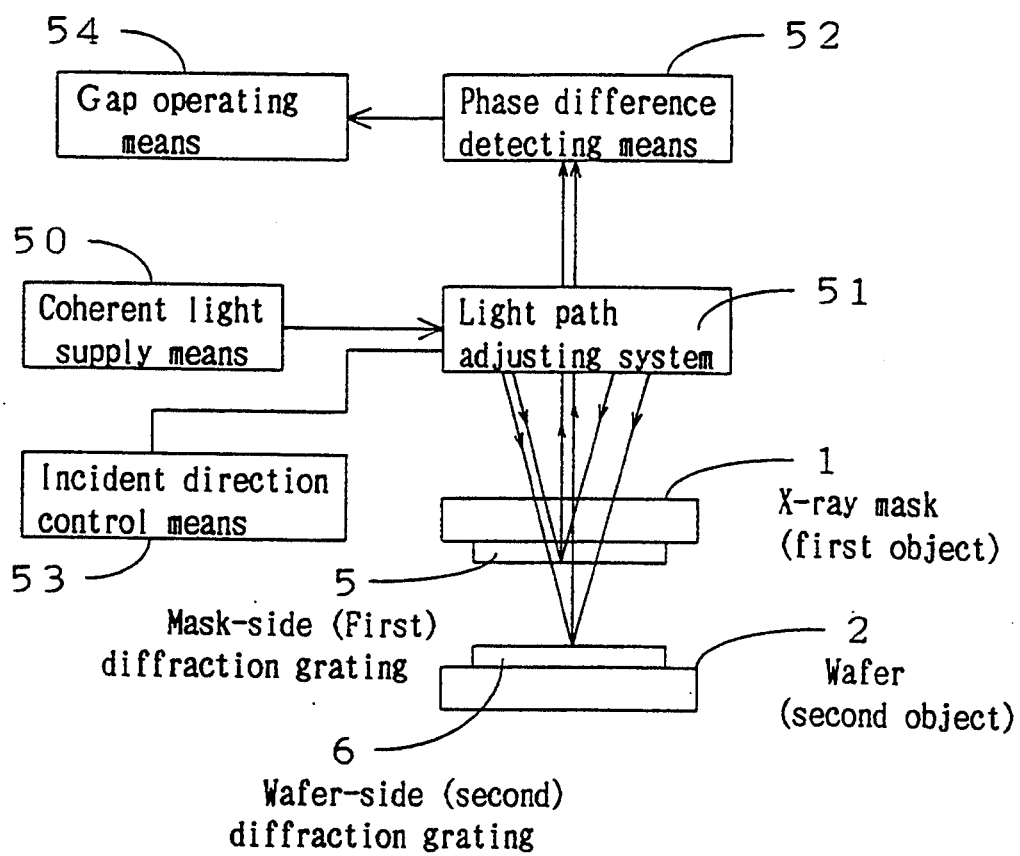
FIG. 1 is a block diagram schematically illustrating the arrangement of a gap control apparatus according to the present invention.
Figure 2:
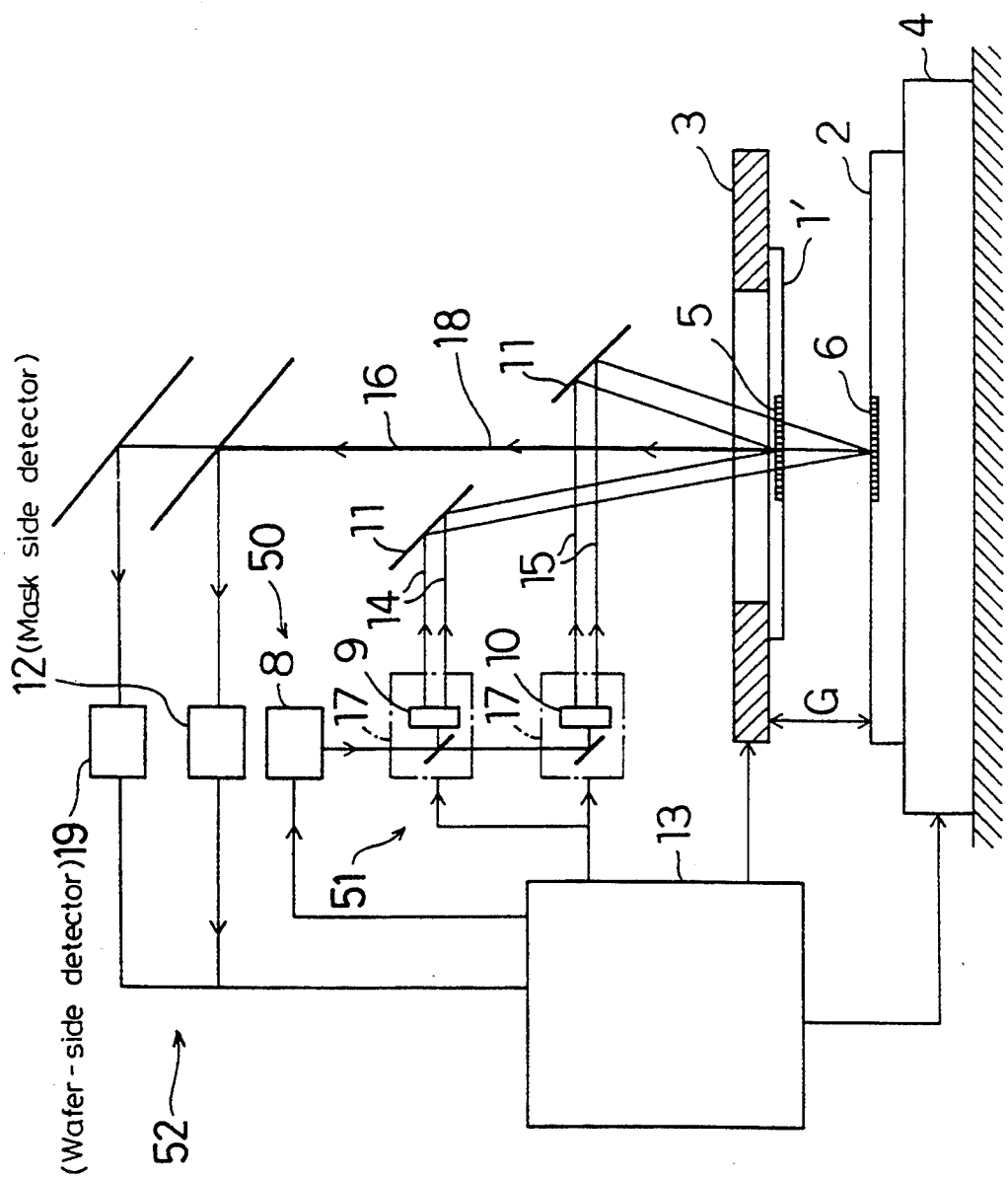
FIG. 2 is a schematic view of the disposition of component elements of a gap control apparatus according to an embodiment of the present invention, illustrating how lights are incident upon and reflected from the mask and the wafer in the apparatus.

FIG. 2 shows the arrangement of the gap control apparatus according to the present invention. In FIG. 2, there are shown an X-ray mask 1 serving as a first object, a wafer 2 serving as a second object, a mask stage 3, a wafer stage 4, a mask-side diffraction grating 5 serving as a first diffraction grating and a wafer-side diffraction grating 6 serving as a second diffraction grating. The distance between the mask-side diffraction grating 5 and the wafer-side diffraction grating 6 substantially corresponds to a mask-wafer gap G. In each of the mask-side diffraction grating 5 and the wafer-side diffraction grating 6, the grate pitch is equal to 4 $\mu$m. There is also disposed a laser source 8. Filters 9, 10 respectively have predetermined polarizing planes and are adapted to take out lights having frequencies f1, f2. The laser source 8 and the filters 9, 10 form coherent light supply means set forth in claim 3. Mirrors 11 are adapted to change the angles of lights incident upon the X-ray mask 1 and the wafer 2. There are also disposed a mask-side photodetector 12, a wafer-side photodetector 19 and a signal processing control unit 13. The light from the laser source 8 is adapted to be divided, by the filters 9, 10, into lights 14, 15 respectively having frequencies f1, f2 (hereinafter, the light having frequency f1 is referred to as the first frequency light 14, and light having frequency f2 is referred to as the second frequency light 15). Incident angle changing and driving systems 17 are adapted to drive the filters 9, 10 and the mirrors 11 to change, to predetermined angles, the incident angles of the first frequency light 14 and the second frequency light 15. The incident angle changing and driving systems 17 and the mirrors 11 form a light path adjusting system set forth in claim 3.

There are also shown mask-side interference light 16, serving as first interference light, as diffracted by the mask-side diffraction grating 5, and wafer-side interference light 18, serving as second interference light, as diffracted by the wafer-side diffraction grating 6. The lights 16, 18 will be discussed later.

When carrying out mask alignment, the X-ray mask 1 and the wafer 2 are respectively loaded on the mask stage 3 and the wafer stage 4, and so set as to be parallel with each other. The light emitted from the laser source 8 is converted into the first frequency light 14 and the second frequency light 15 by the filters 9, 10, respectively. After reflected by the mirrors 11, the first frequency light 14 and the second frequency light 15 are introduced, at predetermined angles, to the mask-side diffraction grating 5 and the wafer-side diffraction grating 6 respectively attached to the X-ray mask 1 and the wafer 2. In each of the mask-side diffraction grating 5 and the wafer-side diffraction grating 6, the grate pitch is equal to 4 $\mu$m. Accordingly, the diffraction gratings 5, 6 are disposed in the same laser spot, and the planes of the same phase thereof are irradiated.

Figure 3:
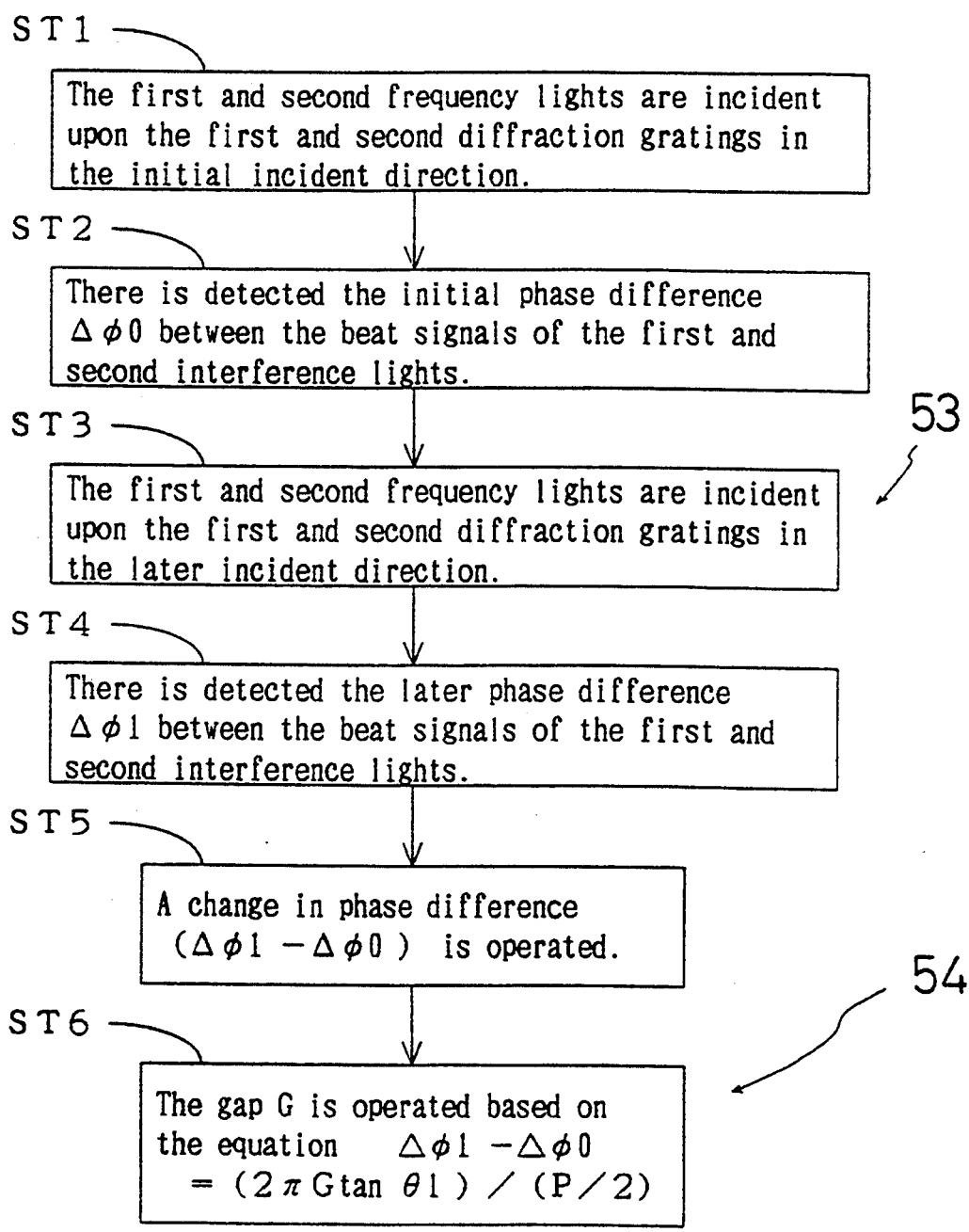
FIG. 3 is a flow chart illustrating the procedure of gap control according to an embodiment of the present invention.
Figure 4A:
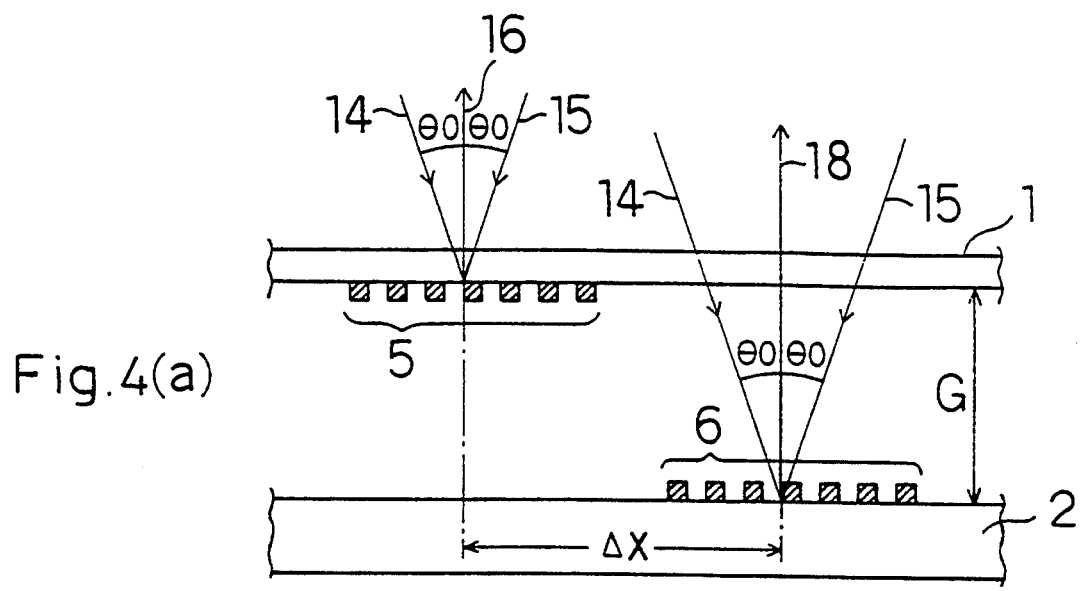
FIG. 4(a) is a side view illustrating the initial state of interference lights in a gap control method according to an embodiment of the present invention.

The following will discuss in detail the gap control method according to an embodiment of the present invention with reference to the flow chart in FIG. 3 and FIGS. 4(a) and (b).

Light generated by the interference of two lights (laser lights) of which frequencies are slightly different from each other, is generally called heterodyne interference light.

At a step ST1 in FIG. 3, the first frequency light 14 having frequency f1 and the second frequency light 15 having frequency f2 are incident upon the diffraction gratings 5, 6 in the directions of +/−first order diffraction angle $\theta 0$ (=9.1°) such that the lights 14, 15 incident upon the diffraction gratings 5, 6 are transversely symmetric. Such incident directions are defined as initial incident directions. The first frequency light 14 and the second frequency light 15 incident upon the mask-side diffraction grating 5 are diffracted in a normal-line direction (initial diffraction direction) by the diffraction grating 5, and then synthesized in the normal-line direction, thus forming heterodyne interference light of which frequency is equal to the difference between the frequencies of the incident lights 14, 15. This heterodyne interference light is defined as mask-side interference light (beat signal) 16. On the other hand, the first frequency light 14 and the second frequency light 15 incident upon the diffraction grating 6 are diffracted also in a normal-line direction by the diffraction grating 6, and then synthesized in the normal-line direction, thus forming wafer-side interference light (beat signal) 18 of which frequency is equal to the difference between the frequencies of the incident lights 14, 15 (See FIG. 4 (a)). The beat signals 16, 18 are respectively guided to the photodetectors 12, 19.

Here, the intensities E1(t), E2(t) of the frequency lights 14, 15 are respectively expressed by the following equations:

$$E1(t) = A1 \cdot \exp j(2\pi f1 t + \phi 1)$$

$$E2(t) = A2 \cdot \exp j(2\pi f2 t + \phi 2)$$

wherein A1, A2 are the amplitudes of the first frequency light 14 and the second frequency light 15, and $\phi 1$, $\phi 2$ are the initial phases thereof.

The intensity Im1 of the mask-side beat signal 16 entered into the mask-side photodetector 12, is expressed by the following equation:

$$Im1 = |E1(t) + E2(t)|^2 = A1^2 + A2^2 + A1A2 \cdot \cos(2\pi |f1-f2| t + \phi 1 - \phi 2)$$

When it is supposed that the position of the mask-side diffraction grating 5 is shifted by a horizontal distance of $\Delta x$ from the position of the wafer-side diffraction grating 6, the intensity Im2 of the wafer-side beat signal 18 is expressed by the following equation:

$$Im2 = A1^2 + A2^2 + A1A2 \cdot \cos\{2\pi |f1-f2| t + \phi 1 - \phi 2 + 2\pi \Delta x/(P/2)\}$$

wherein P is the grate pitch in each of the diffraction gratings.

At this time, differences in light path between left-and right-hand incident lights due to the gap G between the mask-side diffraction grating 5 and the wafer-side diffraction grating 6, are cancelled by each other because the optical systems are transversely symmetric. Accordingly, the beat signals are not changed in phase.

More specifically, a phase difference ($\phi 1 - \phi 2$) between the mask-side beat signal 16 and the wafer-side beat signal 18, is expressed by the equation (1) mentioned earlier:

$$\phi 1 - \phi 2 = 2\pi \Delta x/(P/2) \quad (1)$$

It is now supposed that $\phi 1 - \phi 2$ is equal to $\Delta \phi 0$ which is called an initial phase difference. That is, when initially setting the incident angle changing and driving systems 17, there exists, between the beat signals 16, 18 respectively detected by the photo-detectors 12, 19, an initial phase difference $\Delta \phi 0$ represented by the equation (1).

At a step ST2 in FIG. 3, this initial phase difference $\Delta \phi 0$ is detected by the signal processing control unit 13. The procedure up to the step ST2 is similar to that for positionally aligning the X-ray mask 1 with the wafer 2 mentioned earlier.

Figure 4B:
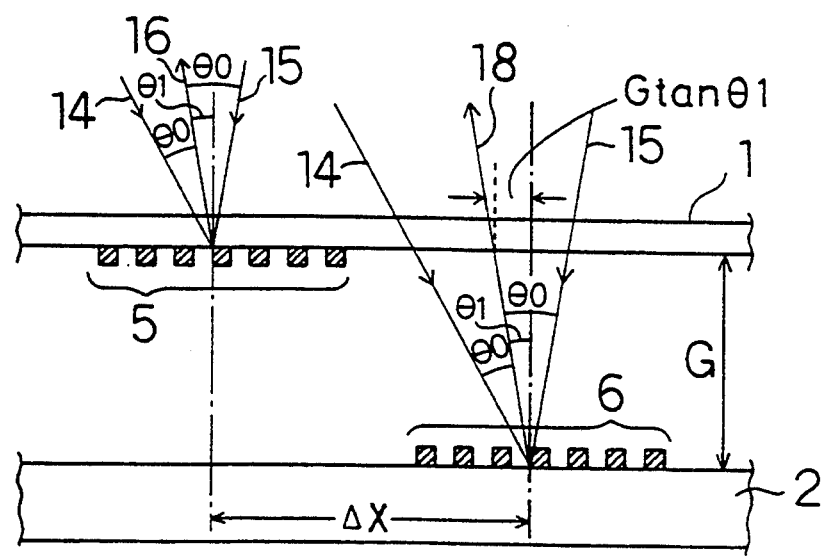
FIG. 4(b) is a side view illustrating the later state of interference lights in the gap control method according to the embodiment of the present invention.

At a step ST3 in FIG. 3, the incident angle changing and driving systems 17 are moved to incline the left- and right-hand optical systems by an angle $\theta 1 = 4.0°$ in the same direction, as shown in FIG. 4(b). However, the X-ray mask 1 and the wafer 2, i.e., the mask-side diffraction grating 5 and the wafer-side diffraction grating 6 remain unchanged. More specifically, the directions of the frequency lights 14, 15 incident upon the diffraction gratings 5, 6 (later incident directions), are inclined at a predetermined angle $\theta 1$ with respect to the initial incident directions above-mentioned.

Accordingly, the first frequency light 14 is incident as inclined at an angle of ($\theta 0 + \theta 1$) with respect to the normal-line direction, and the second frequency light 15 is incident as inclined at an angle of ($\theta 0 - \theta 1$) with respect to the normal-line direction. As a result, the heterodyne interference lights 16, 18 are generated in directions (later diffraction directions) inclined at an angle of $\theta 1$ with respect to the normal-line directions. That position of the mask-side diffraction grating 5 through which passes the beat signal 18 diffracted by the wafer-side diffraction grating 6, is changed by a distance of Gtan $\theta 1$ as shown in FIG. 4(b). That is, both the mask-side diffraction grating 5 and the wafer-side diffraction grating 6 are fixed so that their relative positional relationship is not changed. However, it can be said that the positional shift $\Delta x$ between the diffraction gratings 5, 6 is changed by a horizontal distance of Gtan $\theta 1$. Accordingly, the later phase difference $\Delta \phi 1$ between the beat signals 16, 18, is expressed by the following equation (2):

$$\Delta \phi 1 = 2\pi(\Delta x + G\tan \theta 1)/(P/2) \quad (2)$$

At a step ST4 in FIG. 3, the later phase difference $\Delta \phi 1$ is detected by the signal processing control unit 13.

Based on the equations (1) and (2), a change in phase difference ($\Delta \phi 1 - \Delta \phi 0$) from the initial phase difference $\Delta \phi 0$ between the beat signals 16, 18 to the later phase difference $\Delta \phi 1$ therebetween, is expressed by the following equation (3):

$$\Delta \phi 1 - \Delta \phi 0 = (2\pi G\tan \theta 1)/(P/2) \quad (3)$$

The change in phase difference ($\Delta \phi 1 - \Delta \phi 0$) between the beat signals 16, 18 has no relation with the positional shift $\Delta x$ between the X-ray mask 1 and the wafer 2, but is depending on (proportional to) the mask-wafer gap G.

At a step ST5 in FIG. 3, the change in phase difference ($\Delta \phi 1 - \Delta \phi 0$) from the initial phase difference $\Delta \phi 0$ to the later phase difference $\Delta\phi 1$, is operated by the signal processing control unit 13.

At a step ST6 in FIG. 3, the mask-wafer gap G is operated based on the relation between the change in phase difference ($\Delta\phi 1 - \Delta\phi 0$) of the equation (3) and the mask-wafer gap G.

FIG. 5 shows the relation between the change in phase difference ($\Delta\phi 1 - \Delta\phi 0$) and the mask-wafer gap G where P is equal to 4 $\mu$m and $\theta 1$ is equal to 4°. In FIG. 5, it is understood that the change in phase difference ($\Delta\phi 1 - \Delta\phi 0$) and the mask-wafer gap G have a proportional relationship. From FIG. 5, it is found that the precision of detecting the mask-wafer gap G is about 0.08 $\mu$m where the precision of detecting the change in phase difference ($\Delta\phi 1 - \Delta\phi 0$) is 1° including errors generated in an electrical processing.

More specifically, gap control can be conducted with high precision by vertically moving the mask stage 3 and the wafer stage 4 such that there is obtained the change in phase difference ($\Delta\phi 1 - \Delta\phi 0$) corresponding to a preset mask-wafer gap G.

It is noted that the change in phase difference ($\Delta\phi 1 - \Delta\phi 0$) is obtained by measuring the phase differences. Accordingly, the value of such change in phase difference ($\Delta\phi 1 - \Delta\phi 0$) is meaningful only in the range from 0° to 180°. Therefore, when setting the gap, it is required to previously coarsely set the gap in the range above-mentioned. However, such coarse gap setting is easy because such a range corresponds to 10 $\mu$m or more.

Such optical systems may be advantageously readily arranged since many of alignment optical systems mounted on usual X-ray exposure apparatus may be utilized. In particular, provision may be made such that the gap control apparatus of the present invention also serves as a mask-wafer positional alignment apparatus of the heterodyne system above-mentioned. In such an arrangement, positional alignment between the X-ray mask 1 and the wafer 2 and gap setting may be continuously carried out. Accordingly, the alignment operation can be carried out in a short period of time with high precision required for an X-ray exposure apparatus. Further, most component elements can be commonly used. This advantageously simplifies the structure of the apparatus in its entirety.

Figure 6:
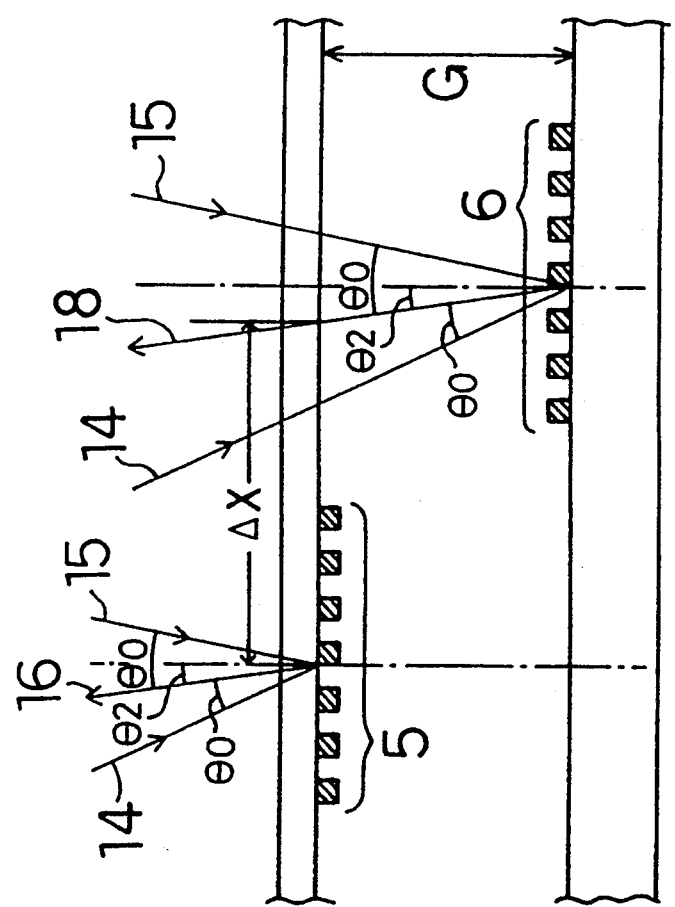
FIG. 6 is a side view illustrating the principle of another example of the gap control method of the present invention.
Figure 7:
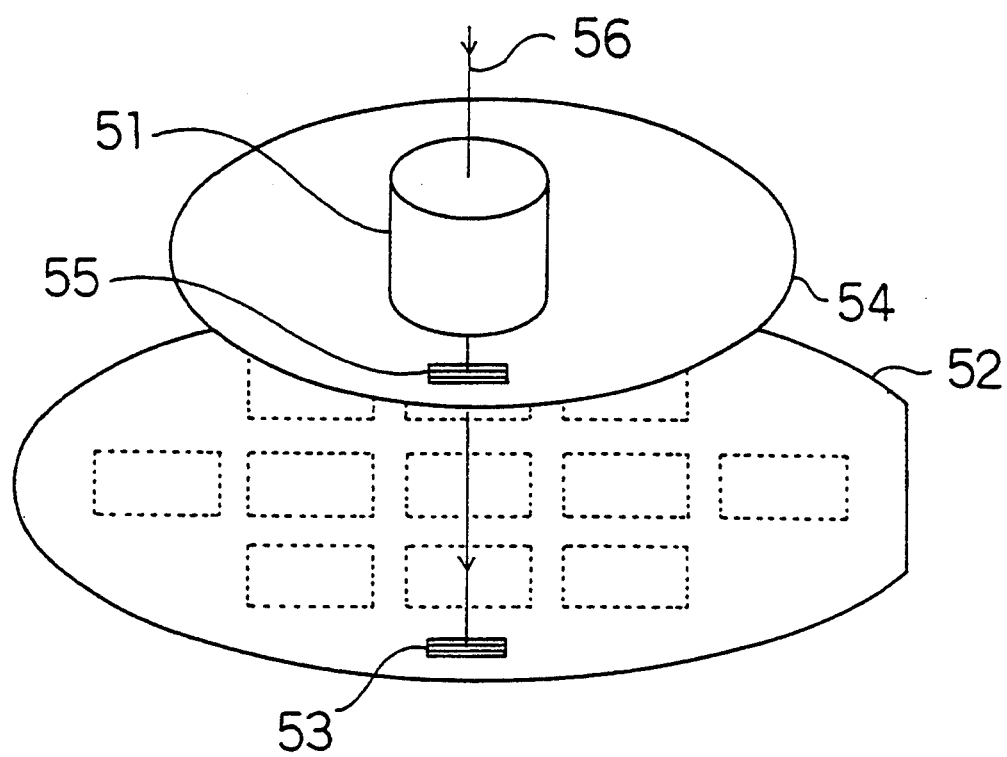
FIG. 7 is a perspective view of an example of a conventional gap detecting system using a lens of double focal points.
Figure 8:
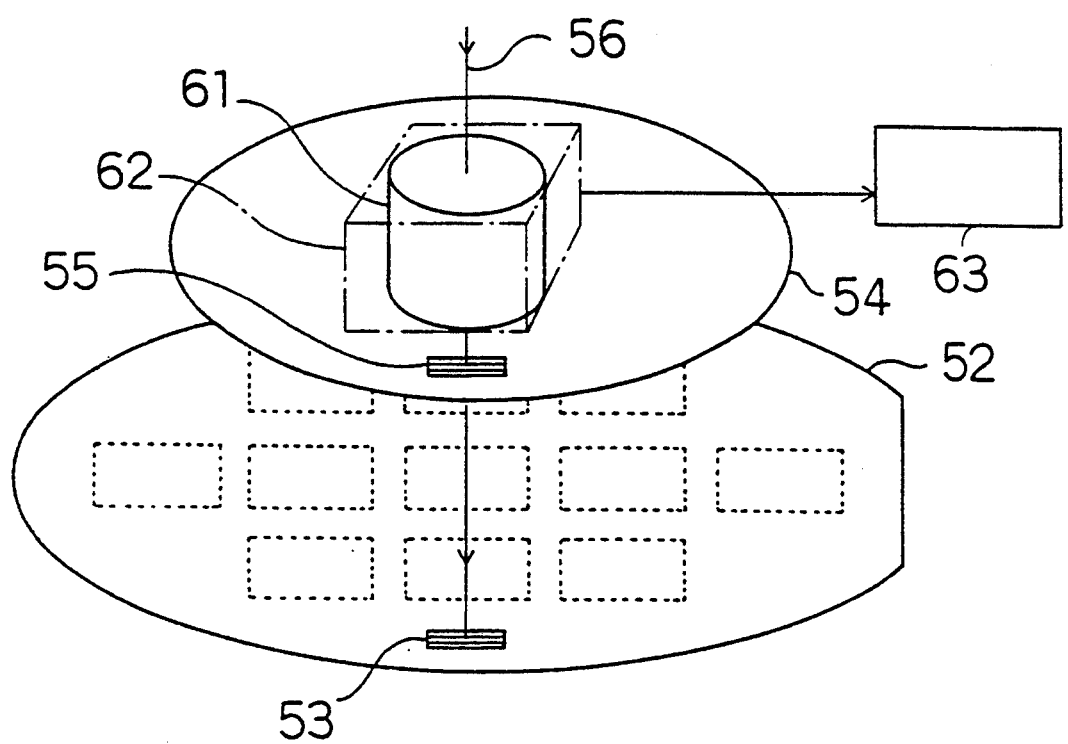
FIG. 8 is a perspective view of an example of a conventional gap detecting system using a lens of single focal point.
Figure 9:
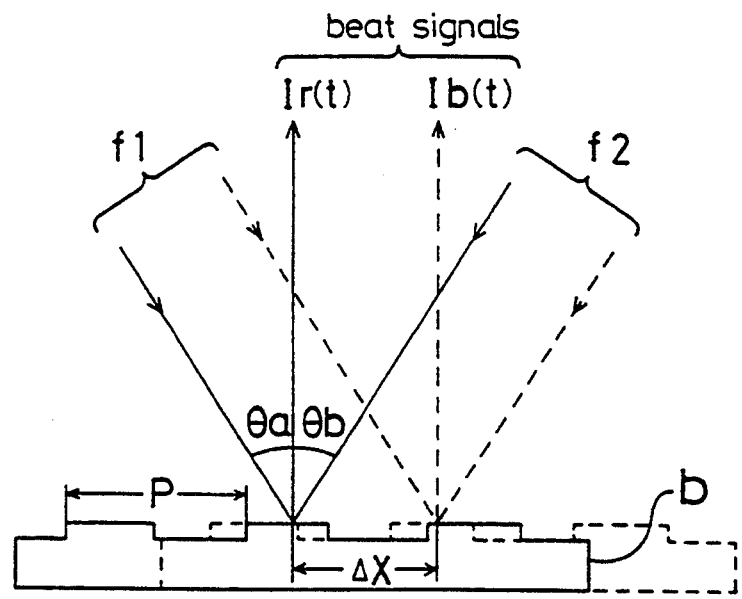
FIG. 9 is a side view illustrating the generation principle of beat signals of heterodyne interference lights.
Figure 10:
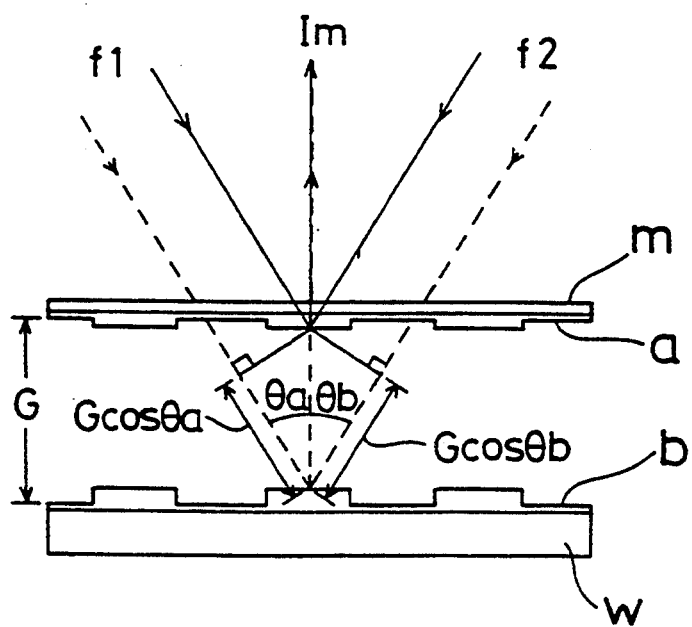
FIG. 10 is a side view illustrating the principle of mask-wafer positional alignment according to the heterodyne interference system.

In the embodiment above-mentioned, the initial incident directions of the first frequency light 14 and the second frequency light 15 are set such that the first frequency light 14 and the second frequency light 15 are first orderly diffracted in normal-line direction of the diffraction gratings 5, 6. However, the present invention is not limited to such an embodiment. For example, as shown in FIG. 6, the initial incident directions may be set such that the initial incident directions are symmetric with respect to directions inclined at the same predetermined angle $\theta 2$ with respect to normal-line directions of the diffraction gratings 5, 6, and that the lights are first orderly diffracted in directions inclined at the same predetermined angle 82 with respect to the normal-line directions of the diffraction gratings 5, 6. Then, the first and second frequency lights 14, 15 may be incident on the diffraction gratings 5, 6 in later incident directions inclined at the same angle in the same direction from the initial incident directions above-mentioned. In such an arrangement, the horizontal distance $\Delta x$ between the diffraction gratings 5, 6 is changed in proportion to the gap G, as done in the embodiment mentioned earlier. It is therefore possible to control the mask-wafer gap G with high precision with the basic relation between the change in phase difference ($\Delta\phi 1 - \Delta\phi 0$) and the mask-wafer gap G utilized as it is.

However, when the initial incident directions are set such that the lights are first orderly diffracted in normal-line directions of the diffraction gratings 5, 6 as done in the embodiment above-mentioned, this presents the advantages that the procedure for gap detection can be simplified and the detection precision is improved.

In the embodiment above-mentioned, the incident angles of the first frequency light 14 and the second frequency light 15 can be changed by rotating the filters 9, 10 and the mirrors 11 by the incident angle changing and driving systems 17. Alternatively, the incident angles may be changed, for example, by moving the mirrors 11. Also, two incident optical systems may be prepared for each of the first frequency lights 14 and the second frequency lights 15, and an incident optical system to be used may be selected by slits to change the incident angles of the first frequency light 14 and the second frequency light 15.

We claim:

1. A gap control method of detecting the gap between a first object and a second object and setting the gap thus detected to a predetermined value, comprising the steps of:

attaching a first diffraction grating to a first object and a second diffraction grating to a second object, the grate pitches in said diffraction gratings being equal to each other, said first and second diffraction gratings being parallel to each other;

causing two coherent lights respectively having slightly different frequencies to be incident upon said diffraction gratings in the directions of the first order diffraction angles (initial incident directions) symmetric with respect to predetermined common directions (initial diffraction directions) of said diffraction gratings, so that said coherent lights are first orderly diffracted in said initial diffraction directions;

detecting, as an initial phase difference, a phase difference between first interference light formed by the interference of said coherent lights first orderly diffracted by said first diffraction grating, and second interference light formed by the interference of said coherent lights first orderly diffracted by said second diffraction grating;

causing said coherent lights to be incident upon said diffraction gratings in later incident directions slightly inclined at the same predetermined angle in the same direction with respect to said initial incident directions, so that said coherent lights are first orderly diffracted in later diffraction directions inclined at a predetermined angle with respect to said initial diffraction directions;

detecting, as a later phase difference, a phase difference between first interference light formed by the interference of said coherent lights first orderly diffracted by said first diffraction grating, and second interference light formed by the interference of said coherent lights first orderly diffracted by said second diffraction grating; and operating, according to a change in phase difference between said detected initial and later phase differences, the gap between said first and second objects, based on the relation between change in phase difference and gap value, said relation being determined by said grate pitch of said diffraction gratings.

2. A gap control method according to claim 1, wherein the initial incident angles of the coherent lights are set such that the initial diffraction directions by the diffraction gratings are normal-line directions of said diffraction gratings.

3. A gap control apparatus for detecting the gap between a first object and a second object and setting the gap thus detected to a predetermined value, comprising:

a first diffraction grating attached to a first object;

a second diffraction grating attached to a second object such that said second diffraction grating is parallel to said first diffraction grating, the grate pitches in said diffraction gratings being equal to each other;

coherent light supply means for emitting two coherent lights respectively having slightly different frequencies;

a light path adjusting system arranged such that two coherent lights emitted from said coherent light supply means are incident upon said diffraction gratings in the directions of the first order diffraction angles symmetric with respect to predetermined common directions of said diffraction gratings, and that the first order diffraction directions by said diffraction gratings can be changed;

phase difference detecting means for detecting a signal relating to a phase difference between first interference light formed by the interference of said coherent lights first orderly diffracted by said first diffraction grating, and second interference light formed by the interference of said coherent lights first orderly diffracted by said second diffraction grating;

incident direction control means for controlling said light path adjusting system such that the directions of said coherent lights incident upon said diffraction gratings are changed to (i) initial incident directions in which the first order diffraction directions by said diffraction gratings are predetermined initial diffraction directions, and (ii) later incident directions in which said first order diffraction directions by said diffraction gratings are later diffraction directions inclined at a predetermined angle with respect to said initial diffraction directions; and gap operating means for operating, according to a change in phase difference between initial and later phase differences detected by said phase difference detecting means in said initial and later first order diffraction directions to be controlled by said incident direction control means, the gap between said first and second objects, based on the relation between change in phase difference and gap value, said relation being determined by said grate pitch of said diffraction gratings.

4. A gap control apparatus according to claim 3, wherein:

the first object is a wafer on which a semiconductor device is to be formed; and the second object is a mask to be used in lithography of said wafer;

said gap control apparatus also serving as a mask-wafer positional alignment apparatus.

* * * * *